United States Patent
Pannwitz

(10) Patent No.: US 11,329,451 B2
(45) Date of Patent: May 10, 2022

(54) DEVICE AND METHOD FOR GENERATING A LASER PULSE

(71) Applicant: Robert Bosch GmbH, Stuttgart (DE)

(72) Inventor: Axel Pannwitz, Radebeul (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/759,048

(22) PCT Filed: Oct. 30, 2018

(86) PCT No.: PCT/EP2018/079620
§ 371 (c)(1),
(2) Date: Apr. 24, 2020

(87) PCT Pub. No.: WO2019/086401
PCT Pub. Date: May 9, 2019

(65) Prior Publication Data
US 2020/0321748 A1    Oct. 8, 2020

(30) Foreign Application Priority Data

Oct. 30, 2017 (DE) .......................... 102017219413.8

(51) Int. Cl.
*H01S 5/042* (2006.01)
*H01S 5/06* (2006.01)
*G01S 7/484* (2006.01)

(52) U.S. Cl.
CPC .......... *H01S 5/0428* (2013.01); *H01S 5/0615* (2013.01); *G01S 7/484* (2013.01)

(58) Field of Classification Search
CPC .... H01S 5/0615; H01S 5/0427; H01S 5/0428; H01S 5/06253; H01S 5/06251–06258; H01S 5/0265; H01S 5/0601; H01S 5/0602
See application file for complete search history.

(56) References Cited

U.S. PATENT DOCUMENTS 3,944,854 A    3/1976  Keller
4,359,773 A *  11/1982  Swartz .................. H01S 5/4031
                                              372/26

(Continued)

FOREIGN PATENT DOCUMENTS

DE    3711051 A1    10/1987
JP    S60107372 A    6/1985

(Continued)

OTHER PUBLICATIONS

International Search Report for PCT/EP2018/079620, dated Feb. 11, 2019.

(Continued)

*Primary Examiner* — Tod T Van Roy
(74) *Attorney, Agent, or Firm* — Norton Rose Fulbright US LLP; Gerard Messina

(57) ABSTRACT

A device for generating a laser pulse. The device includes a laser diode that includes a first diode and a second diode, so that the laser diode includes a first anode, a second anode, and a cathode. The device further includes a first voltage potential that is electrically connected to the second anode, a second voltage potential that has a lower value than the first voltage potential, a first switch that is electrically connected to the first anode and to the second voltage potential, and a second switch that is electrically connected to the cathode and to the second voltage potential. A resistor is electrically connected to the first anode and to the second anode.

14 Claims, 6 Drawing Sheets

(56) References Cited

U.S. PATENT DOCUMENTS

| | | | |
|---|---|---|---|
| 5,736,881 A | 4/1998 | Ortiz | |
| 2003/0058906 A1* | 3/2003 | Finn | H01S 5/06825 |
| | | | 372/34 |
| 2003/0185257 A1 | 10/2003 | Suzuki et al. | |
| 2017/0085057 A1 | 3/2017 | Barnes et al. | |

FOREIGN PATENT DOCUMENTS

| | | | |
|---|---|---|---|
| JP | S625679 A | 1/1987 |
| JP | 2010533965 A | 10/2010 |
| JP | 2012151248 A | 8/2012 |
| JP | 2016507167 A | 3/2016 |

OTHER PUBLICATIONS

Office Action dated Jul. 7, 2021 by the JPO in the corresponding Patent Application No. 2020-523996.

\* cited by examiner

DEVICE AND METHOD FOR GENERATING A LASER PULSE

FIELD

The present invention relates to a device and a method for generating a laser pulse.

BACKGROUND INFORMATION

Passive and active systems are available for controlling so-called Q-switch lasers. The gain region of the lasers includes a pump area in which the energy is generated and stored, and a switch area that releases the stored energy. In passive systems, the stored energy is released when the energy in the pump area has exceeded a certain threshold value; i.e., this is a self-opening system. In active systems, the switch area is controlled by an external action, for example by opening a switch with the aid of current.

It is disadvantageous that the pump area and the switch area must be controlled separately, so that complicated control circuits, for example high-side switches and low-side switches, are required. This means that special control circuits that include level adjustment and a floating supply voltage are necessary. In addition, it is disadvantageous that the transit times in the control circuit are high. Furthermore, high rates of voltage rise during the pumping operation may result in inadvertent triggering of a laser pulse in the switch area.

An object of the present invention is to simplify the control circuit.

SUMMARY

In accordance with the present invention, an example device is provided for generating a laser pulse which includes a laser diode that includes a first diode and a second diode, so that the laser diode includes a first anode, a second anode, and a cathode. In other words, the first anode of the laser diode corresponds to an anode of the first diode, and the second anode of the laser diode corresponds to an anode of the second diode. A cathode of the first diode and a cathode of the second diode are electrically connected in such a way that the laser diode includes a single, i.e., shared, cathode. The example device includes a first voltage potential that is electrically connected to the second anode, and a second voltage potential that has a lower value than the first voltage potential. The device also includes a first switch that is electrically connected to the first anode and to the second voltage potential, and a second switch that is electrically connected to the cathode and to the second voltage potential. According to the present invention, a resistor is electrically connected to the first anode and to the second anode.

An advantage is that the control of the pump area and of the switch area takes place with the aid of a single control circuit, i.e., not separately.

In one refinement of the present invention, the resistor is low-resistance, in particular having a resistance of less than 1 kΩ.

In accordance with the present invention, it is advantageous that the switching operation may be carried out quickly and eye safety is ensured, since short pulses having less energy are generated.

In another embodiment of the present invention, the first switch and the second switch are designed as NMOS transistors.

An advantage is that the switches have small space requirements and short switching times.

In one refinement of the present invention, the laser diode has a monolithic design.

It is advantageous that the device has low inductance.

In another embodiment of the present invention, storage capacitors are provided which provide, include, hold constant, or stabilize the first voltage potential and the second voltage potential. In other words, backup capacitors are present that hold ready or stabilize the voltage for the laser diode.

An advantage is that the laser module is directly connected to the storage capacitors, and therefore no line subject to inductance, which influences the current rise in the laser diode, leads directly from the voltage source to the laser diode. Between the laser pulses the capacitors are recharged by a voltage source. The inductances of the power supply do not interfere.

In accordance with an example embodiment of the present invention, the method for generating a laser pulse, using a laser diode that includes a first diode and a second diode, so that the laser diode includes a first anode, a second anode, and a cathode, and a resistor that is electrically connected to the first anode and to the second anode, includes closing a first switch that is electrically connected to the first anode and to a second voltage potential, so that a first current path is formed that extends from the first voltage potential, across the resistor, to the second voltage potential. The example method includes closing a second switch that is electrically connected to the cathode and to the second voltage potential, so that the cathode has the second voltage potential, and a pump current is generated that introduces energy within a second current path, the second current path extending from the first voltage potential, across the second diode, to the second voltage potential. In addition, the method includes opening the first switch as a function of exceeding a first threshold value, so that the course of the first current path is changed, the first current path extending from the voltage potential, across a series connection, from the resistor and the first diode to the second voltage potential, the energy over the first current path being reduced, and the laser pulse being emitted. The method includes opening the second switch as a function of exceeding a second threshold value that represents a second time period.

An advantage is that the currents in the first current path and in the second current path have time to build up or establish due to the use of low-side switching.

In one refinement of the present invention, the first threshold value represents a first time period.

It is advantageous that the implementation is simple.

In another embodiment of the present invention, the first threshold value is determined as a function of a temperature value of a substrate of the laser diode.

An advantage is that the efficiency is optimal, since the pump current does not have to be started an unnecessarily long time prior to emitting the laser pulse.

In one refinement of the present invention, the first threshold value represents a value of the pump current.

An example vehicle according to the present invention includes an example device for generating a laser pulse in accordance with the present invention, the device including a laser diode that includes a first diode and a second diode, so that the laser diode includes a first anode, a second anode, and a cathode. The device includes a first voltage potential that is electrically connected to the second anode, and a second voltage potential that has a lower value than the first voltage potential. The device also includes a first switch that is electrically connected to the first anode and to the second voltage potential, and a second switch that is electrically connected to the cathode and to the second voltage potential. A resistor is electrically connected to the first anode and to the second anode.

Further advantages result from the following description of exemplary embodiments and from the figures.

BRIEF DESCRIPTION OF THE DRAWINGS

The present invention is explained below with reference to preferred specific embodiments and figures.

DETAILED DESCRIPTION OF EXAMPLE EMBODIMENT

Figure 1:
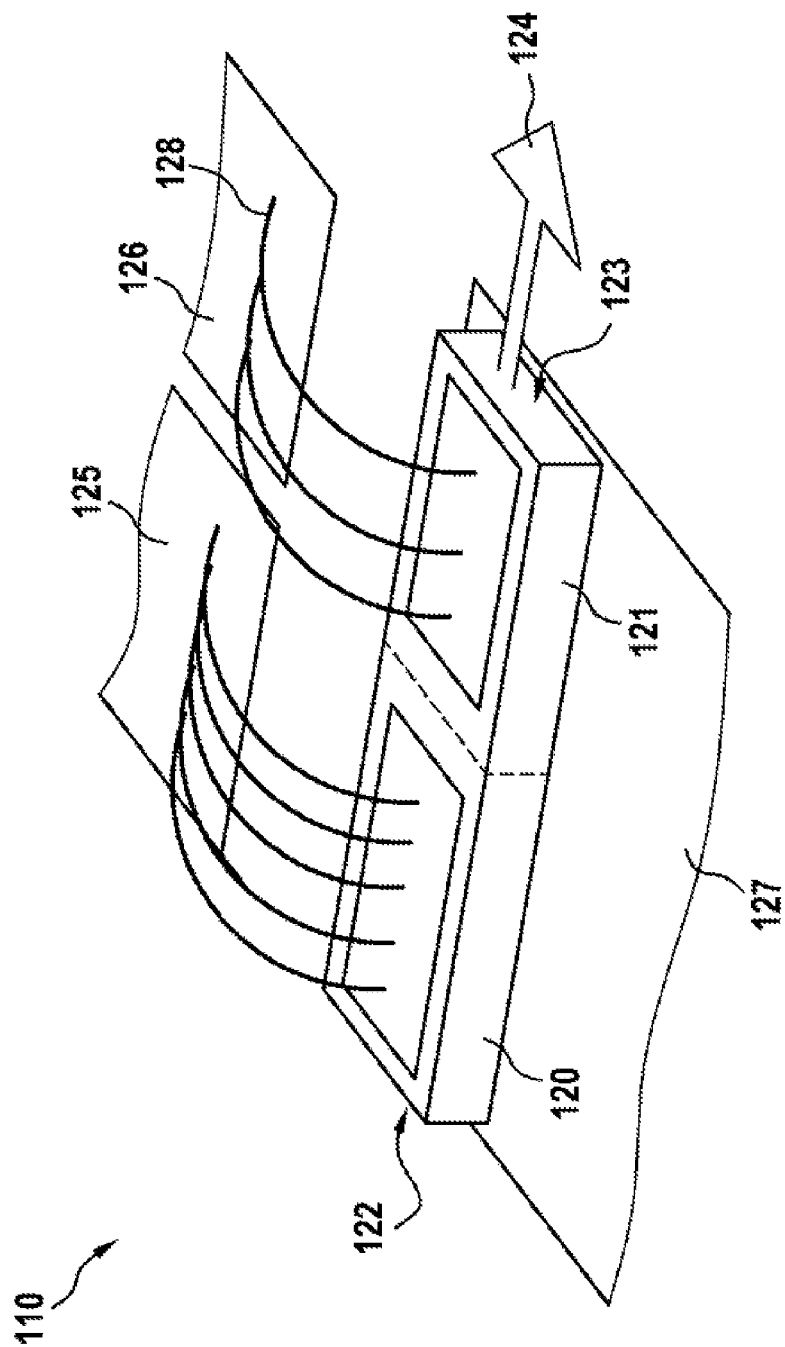
FIG. 1 shows a Q-switch laser diode from the related art, including a controller made up of two high-side switches and a shared ground.

FIG. 1 shows a Q-switch laser diode from the related art that includes a controller made up of two high-side switches and a shared ground. FIG. 1 shows laser diode 110, which has a monolithic design. Laser diode 110 includes a pump area 120 and a switch area 121. Pump area 120 and switch area 121 are electrically connected to one another. The connection material may be the substrate on which laser diode 110 is situated. Pump area 120 and switch area 121 include a shared cathode 127 or ground. A highly reflective mirror 122 is situated on a short side of pump area 120. The side of the pump area opposite from highly reflective mirror 122 is directly connected to a short side of switch area 121. Switch area 121 includes a semi-reflective mirror 123, situated opposite from the short side of switch area 121, which is directly connected to pump area 120. Pump area 120 is connected with the aid of bond wires 128 to a first supply line 125 that conducts the pump current. Switch area 121 is connected with the aid of bond wires 128 to a second supply line 126 that conducts the switching current. FIG. 1 shows the exit of laser pulse 124.

Figure 2:
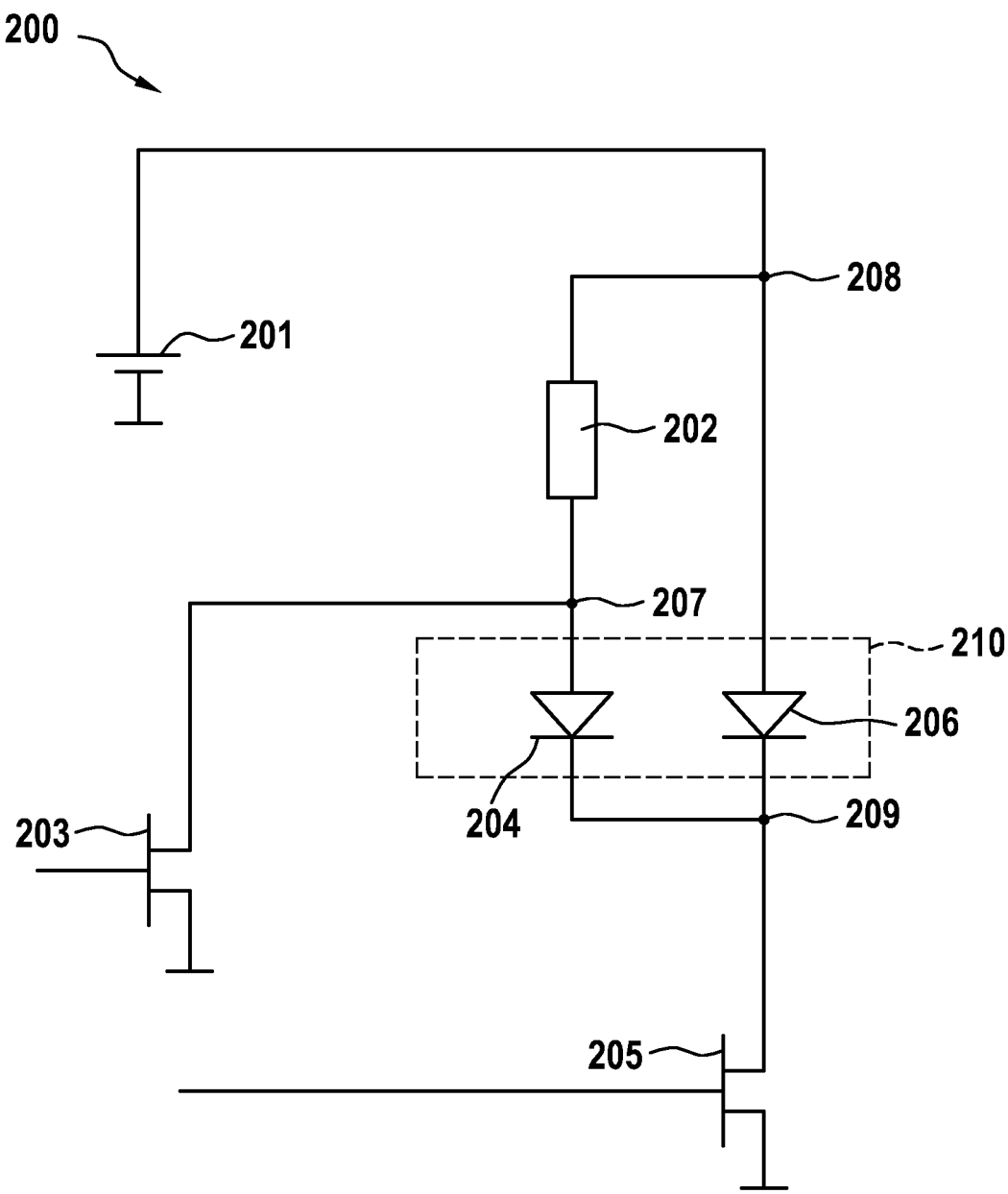
FIG. 2 shows an equivalent circuit diagram of a device for generating a laser pulse.
Figure 6:
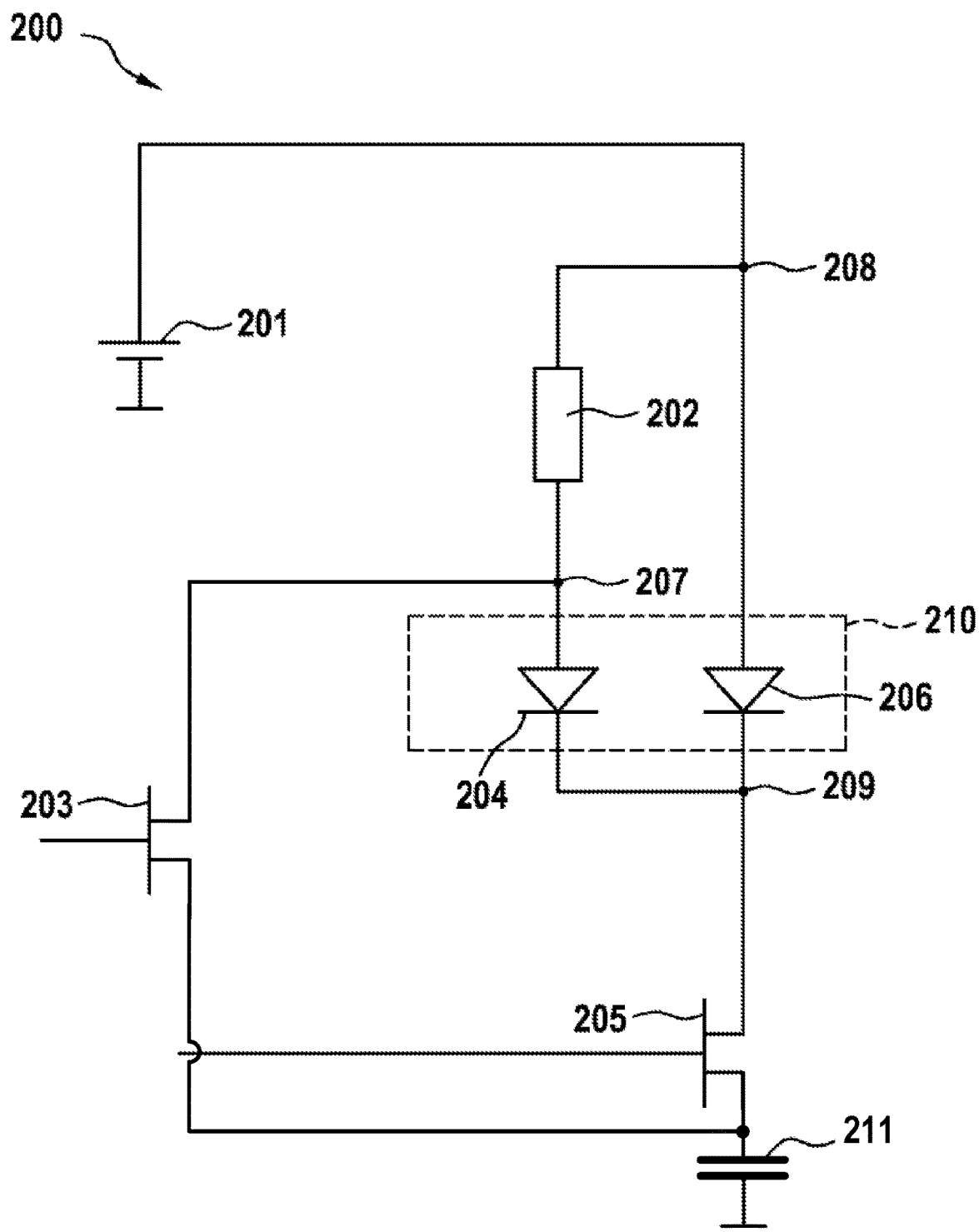
FIG. 6 shows a circuit diagram that of FIG. 2, except that a second voltage potential is provided in the form of a storage capacitor.

FIG. 2 shows an equivalent circuit diagram of a device 200 for generating a laser pulse in accordance with the present invention. Device 200 includes a component 201 for providing or stabilizing a supply voltage, a first voltage potential and a second voltage potential being provided. Component 201 is a backup capacitor or a battery, for example. The second voltage potential is ground, for example. Alternatively, as shown in FIG. 6, the second voltage potential is provided as a storage capacitor 211. Device 200 includes a laser diode 210, which includes a first diode 204 and a second diode 206. First diode 204 and second diode 206 each include an anode and a cathode. Thus, laser diode 210 includes a first anode 207 and a second anode 208 as well as a single cathode 209, since the cathode of first diode 204 and the cathode of second diode 206 are electrically connected to one another. First diode 204 functions as a switching diode, and second diode 206 functions as a pump diode. First anode 207 and second anode 208 are electrically connected via a resistor 202. Resistor 202 may also be designed as a line resistor. Device 200 includes a first switch 203. First switch 203 is implemented in the form of a transistor, for example a MOSFET. A drain terminal of first switch 203 is electroconductively connected to first anode 207. In addition, device 200 includes a second switch 205. Second switch 205 is likewise implemented in the form of a transistor, for example a MOSFET. A drain terminal of second switch 205 is electroconductively connected to cathode 209. The source terminals of first switch 203 and of second switch 205 are electrically connected to the second voltage potential.

Figure 3:
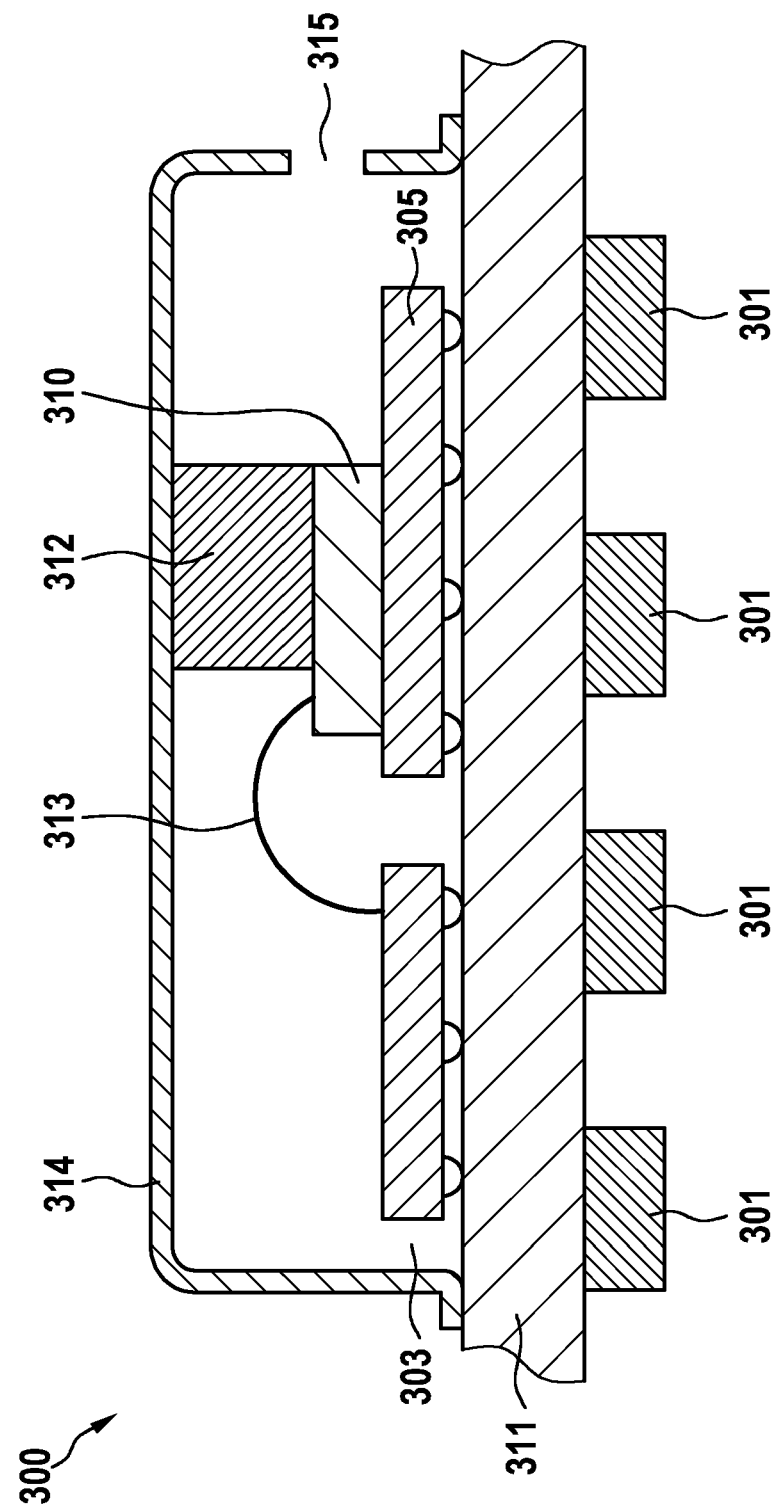
FIG. 3 shows a module in which the laser diode is situated.

FIG. 3 shows a module 300 in which the device for generating a laser pulse is situated or installed. Module 300 includes a substrate 311 on which a first switch 303 and a second switch 305 are situated. First switch 303 functions as a control switch and second switch 305 functions as a pump switch. First switch 303 and second switch 305 are connected to substrate 311 with the aid of a soldered joint, for example. First switch 303 and second switch 305 are NMOS transistors, for example, the drain terminal being situated on a first side of a semiconductor substrate, and the source terminal and the gate terminal being situated on a second side of the semiconductor material, the first side being situated opposite from the second side. A laser diode 310 is situated on second switch 305. Laser diode 310 may be conductively glued, soldered, or bonded to second switch 305, so that the shared cathode of the laser diode is connected to the second switch. The terminal inductance between second switch 305 and laser diode 310 is thus low. Laser diode 310 is electrically connected to first switch 303 with the aid of bond connection 313. An element 312 for electrically connecting laser diode 310, for example a so-called Kovar stamping, is situated on laser diode 310. This is a metal alloy having the same coefficient of expansion as glass. Element 312 for electrically connecting the laser diode 310 is connected to a housing 314. Housing 314 includes an opening 315 for the laser pulses to exit. A voltage stabilizer in the form of storage capacitors 301, for example, may be situated beneath substrate 311. Substrate 311 may be a multilayer ceramic or a PCB, for example. Ideally, first switch 303 and second switch 305 are situated close to one another so that the terminal of the first anode to the drain terminal of the first switch, i.e., the control anode terminal, has a low inductance. Very short bond wires may thus be used for the connection. The terminal of the second anode, i.e., the pump anode terminal, may take place via housing 314, for example. For this purpose, for example the Kovar stamping may be soldered onto the laser diode crystal. The top side of the Kovar stamping is subsequently provided with solder, so that housing 314 may be soldered on after the bonding operation. The resistor between the first anode and the second anode is not shown in FIG. 3, but is present. The low-resistance resistor is integrated onto the laser diode die, for example with the aid of a shared final epitaxial layer below the anode terminals, i.e., the first anode and the second anode. Alternatively, the resistor is produced with the aid of thin film metal plating in an additional process step, or by structuring the terminal metal plating.

Figure 4:
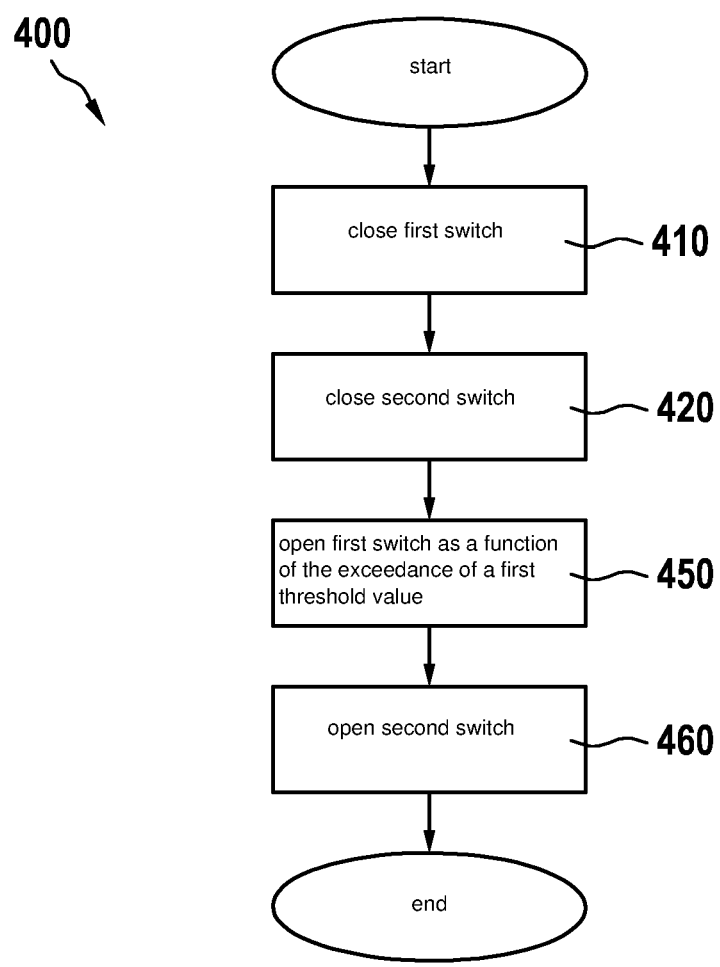
FIG. 4 shows a method for generating a laser pulse.

FIG. 4 shows an example method 400 for generating a laser pulse in accordance with the present invention. Method 400 starts with step 410, in which a first switch is closed. A drain terminal of the first switch is electrically connected to a first anode of the laser diode, so that the first anode of the laser diode has a second voltage potential, i.e., ground, due to closing the first switch. In other words, the first anode is switched to ground with the aid of an NMOS switch prior to switching on the pump current. A second switch is closed in a subsequent step 420. The second switch is electrically connected to the cathode on the drain side, and to the second voltage potential on the source side, so that the cathode has the second voltage potential due to closing the second switch, and a pump current may build up in the pump area. In other words, the cathode of the laser diode is connected to ground when the pump switch is switched on. A pump current then builds up in the pump area of the laser diode. Since the cathode as well as the control terminal are connected to ground, there is no emission of laser light. The first switch is opened in a subsequent step 450 as a function of the exceedance of a first threshold value. The first threshold value may be a first time period or a pump current value. The first time period may be determined as a function of a temperature value of the laser diode substrate. In other words, the control switch is opened when the pump current is completely built up. This may be determined, for example, by measuring the pump current, the temperature, or a predetermined time period. After the control switch is opened, the control current builds up in the switch area, and upon reaching a certain current threshold of the control current, a laser pulse is emitted. Since after emission of the light pulse the laser diode still operates as a laser, but with much weaker light output due to the pumped energy being expended, the second switch is also opened in a subsequent step 460. The opening of the second switch takes place directly after emission of the laser pulse in order to keep the overall quantity of light emitted preferably small.

Figure 5:
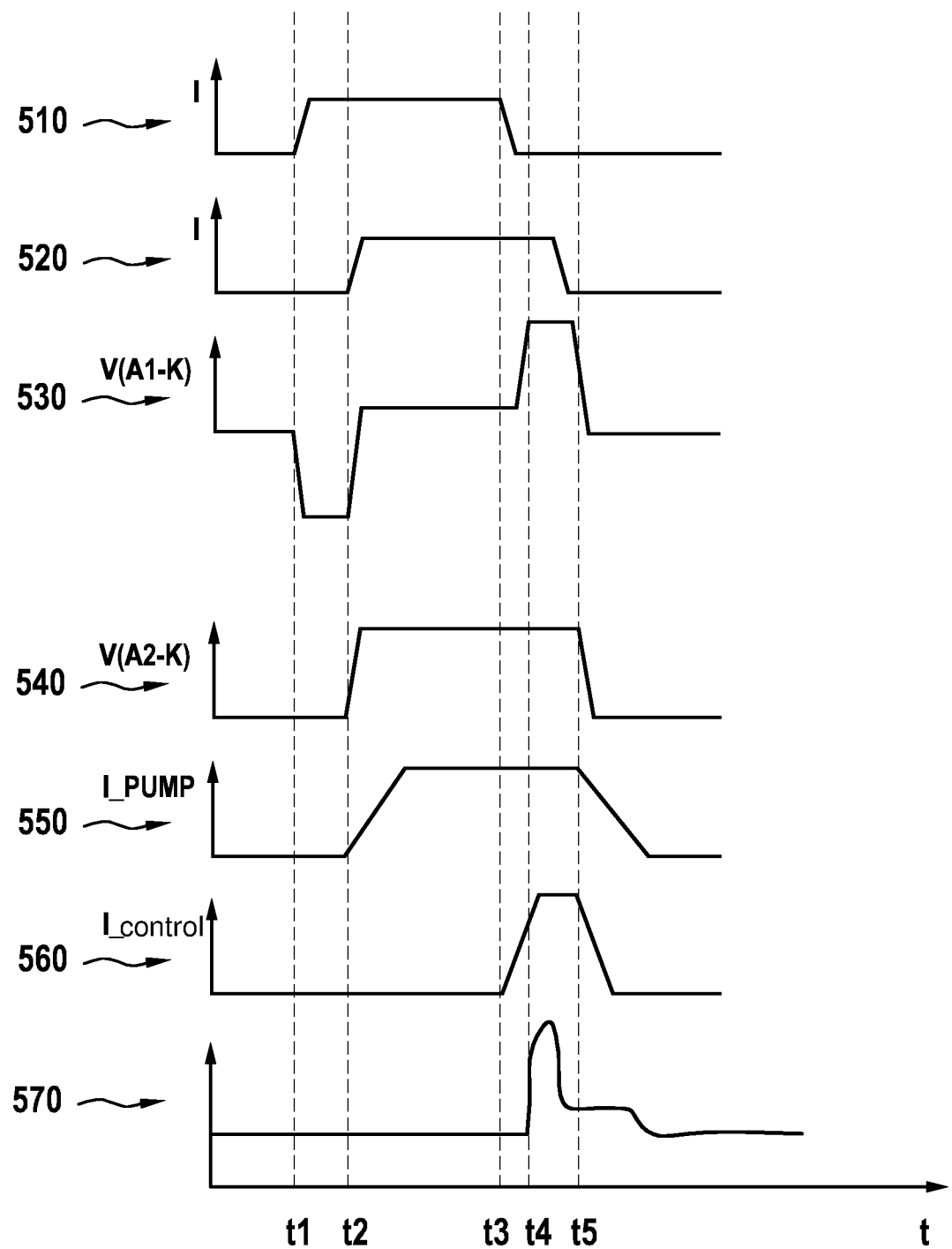

FIG. 5 quantitatively shows the time curve of current and voltage during the method from FIG. 4. Curve 510 shows the current time curve across the first switch. Curve 520 shows the current time curve across the second switch. Curve 530 shows the voltage time curve between the first anode and the cathode. Curve 540 shows the voltage time curve between the second anode and the cathode. Curve 550 shows the time curve of the pump current, and curve 560 shows the time curve of the control current. Curve 570 shows the time curve of the laser pulse. The first switch is closed at point in time t1, as the result of which the switch area is deactivated and the first diode is operated in the reverse direction. A high current flows through the resistor for a short time. The second switch is closed at point in time t2, as the result of which the cathode is connected to ground. In curve 550 it is apparent that the pump current rises until it reaches saturation. However, this does not result in emission of laser light, since the first diode and the shared cathode are connected to ground. The first switch is opened, the pump current remains constantly saturated, and the control current rises at point in time t3. A laser pulse is emitted when saturation of the control current is reached at point in time t4. The second switch is opened at point in time t5, so that the first diode is switched in the flow direction.

The device may be used, for example, in LIDAR systems for vehicles. These systems require a large range, which is achieved by the brief, bright laser pulses. The light pulses preferably have a duration of 0.5 ns to 2 ns.

What is claimed is:

1. A device for generating a laser pulse, comprising:
    a laser diode that includes a first diode and a second diode, wherein the first diode has a first anode, the second diode has a second anode, and the first and second diodes share a single cathode;
    a first voltage potential electrically connected to the second anode;
    a second voltage potential that has a lower value than the first voltage potential;
    a resistor;
    a first switch that is electrically connected to the first anode and to the second voltage potential, wherein:
    the first anode is electrically connected between the resistor and first switch;
    the resistor is electrically connected between the first anode and the second anode; and
    the first switch is configured to switch between:
    (a) a closed state in which the first switch connects the first voltage potential to the second voltage potential via the resistor and provides the second voltage potential to the first anode; and
    (b) an open state in which the first voltage potential is not connected to the second voltage potential via the first switch and in which the first anode is not connected to the second voltage potential and is connected to the first voltage potential via the resistor; and
    a second switch that, when closed, electrically connects the shared single cathode to the second voltage potential.

2. The device as recited in claim 1, wherein the resistor has a resistance of less than 1 Ω).

3. The device as recited in claim 1, wherein the first switch and the second switch are NMOS transistors.

4. The device as recited in claim 1, wherein the laser diode has a monolithic design.

5. The device as recited in claim 1, wherein the second voltage potential is provided by at least one storage capacitor.

6. A method for generating a laser pulse using a first voltage potential, a second voltage potential, and a laser diode that includes a first diode that has a first anode and a second diode that has a second anode, wherein a single cathode is shared by the first diode and the second diode, and wherein a resistor is electrically connected between the first anode and the second anode, the method comprising the following steps:
    closing a first switch that is electrically connected to the first anode and to the second voltage potential, so that a first current path is formed that extends from the first voltage potential to the second voltage potential via the resistor;
    closing a second switch that is electrically connected to the shared single cathode and to the second voltage potential, so that (a) the shared single cathode has the second voltage potential, and (b) a pump current is generated that introduces energy within a second current path, the second current path extending from the first voltage potential to the second voltage potential via the second diode;
    in response to a first threshold being reached while the first switch and the second switch are closed due to the closing of the first switch and the closing of the second switch, opening the first switch while the second switch remains closed, so that a course of the first current path is changed to extend from the first voltage potential to the second voltage potential via the resistor and the first diode, the opening of the first switch in response to the first threshold being reached and while the second switch remains closed thereby causing the laser pulse to be emitted; and
    subsequent to the emission of the laser pulse, opening the second switch, thereby causing a voltage drop across the first and second diodes.

7. The method as recited in claim 6, wherein the first threshold value represents a first time period.

8. The method as recited in claim 6, wherein the first threshold value is a temperature value, so that the first threshold is reached when a temperature of a substrate of the laser diode rises to the temperature value.

9. The method as recited in claim 6, wherein the first threshold value represents a value of the pump current.

10. The method as recited in claim 6, wherein the closing of the first switch occurs while the second switch is open, and the closing of the second switch is performed after the closing of the first switch.

11. The method as recited in claim 10, wherein the closing of the first switch causes a voltage drop across the first diode without a voltage drop across the second diode.

12. The method as recited in claim 11, wherein the closing of the second switch causes a voltage rise across the first diode and across the second diode.

13. The method as recited in claim 12, wherein the opening of the first switch causes a further voltage rise across the first diode without causing a rise of voltage across the second diode.

14. A vehicle that includes a device for generating a laser pulse, the device comprising:
  a laser diode that includes a first diode and a second diode, wherein the first diode has a first anode, the second diode has a second anode, and the first and second diodes share a single cathode;
  a first voltage potential electrically connected to the second anode;
  a second voltage potential that has a lower value than the first voltage potential;
  a resistor;
  a first switch that is electrically connected to the first anode and to the second voltage potential, wherein:
  the first anode is electrically connected between the resistor and first switch;
  the resistor is electrically connected between the first anode and the second anode; and
  the first switch is configured to switch between:
  (a) a closed state in which the first switch connects the first voltage potential to the second voltage potential via the resistor and provides the second voltage potential to the first anode; and
  (b) an open state in which the first voltage potential is not connected to the second voltage potential via the first switch and in which the first anode is not connected to the second voltage potential and is connected to the first voltage potential via the resistor; and
  a second switch that, when closed, electrically connects the shared single cathode to the second voltage potential.

* * * * *